United States Patent
Shimanuki et al.

(10) Patent No.: US 9,343,334 B2
(45) Date of Patent: May 17, 2016

(54) ELECTRONIC COMPONENT AND METHOD FOR MANUFACTURING ELECTRONIC COMPONENT

(71) Applicant: Sumida Corporation, Chuo-ku, Tokyo (JP)

(72) Inventors: Yasuo Shimanuki, Chiba (JP); Masakazu Fukuoka, Miyagi (JP)

(73) Assignee: SUMIDA CORPORATION (JP)

( * ) Notice: Subject to any disclaimer, the term of this patent is extended or adjusted under 35 U.S.C. 154(b) by 30 days.

(21) Appl. No.: 14/519,658

(22) Filed: Oct. 21, 2014

(65) Prior Publication Data

US 2015/0108627 A1    Apr. 23, 2015

(30) Foreign Application Priority Data

Oct. 23, 2013    (JP) .................. 2013-220292

(51) Int. Cl.
*H01L 21/56* (2006.01)
*H01L 23/29* (2006.01)
(Continued)

(52) U.S. Cl.
CPC .......... *H01L 21/565* (2013.01); *H01L 23/293* (2013.01); *H01L 23/3107* (2013.01); *H01L 23/3121* (2013.01); *H01L 23/49861* (2013.01); *H01L 24/13* (2013.01); *H01L 24/16* (2013.01); *H01L 24/29* (2013.01); *H01L 24/32* (2013.01); *H01L 24/81* (2013.01); *H01L 24/83* (2013.01);
(Continued)

(58) Field of Classification Search
CPC ............ H01L 23/3121; H01L 23/3675; H01L 23/642; H01L 23/645; H01L 23/16
See application file for complete search history.

(56) References Cited

U.S. PATENT DOCUMENTS

| | | | |
|---|---|---|---|
| 5,767,528 A * | 6/1998 | Sumi et al. .......... | H01L 21/565 257/48 |
| 6,194,778 B1 * | 2/2001 | Ohsawa et al. ......... | H01L 23/24 257/668 |

(Continued)

FOREIGN PATENT DOCUMENTS

| | | |
|---|---|---|
| JP | 63-208236 A | 8/1988 |
| JP | 2001-184471 A | 7/2001 |
| WO | 2011/024559 A1 | 3/2011 |

*Primary Examiner* — Roy Potter
(74) *Attorney, Agent, or Firm* — Cantor Colburn LLP (57) ABSTRACT

An electronic component comprises: a resin frame; a semiconductor substrate housed in the resin frame; a plate shape metal member having at least one end fixed in the resin frame at a position spaced apart from the semiconductor substrate; an electrical connection region portion formed on the surface on the side of the plate shape metal member of the semiconductor substrate with an electrically conductive material; and a solder layer formed on the surface on the side of the plate shape metal member of the electrical connection region portion, wherein the plate shape metal member supports the semiconductor substrate without contact through the solder layer and the electrical connection region portion, and is electrically connected to the electrical connection region portion.

7 Claims, 10 Drawing Sheets

(51) Int. Cl.
*H01L 23/31* (2006.01)
*H01L 23/00* (2006.01)
*H01L 23/498* (2006.01)
*H01L 23/495* (2006.01)

(52) U.S. Cl.
CPC ............ *H01L 23/49551* (2013.01); *H01L 2224/10165* (2013.01); *H01L 2224/131* (2013.01); *H01L 2224/13005* (2013.01); *H01L 2224/13111* (2013.01); *H01L 2224/16057* (2013.01); *H01L 2224/16258* (2013.01); *H01L 2224/26165* (2013.01); *H01L 2224/291* (2013.01); *H01L 2224/29005* (2013.01); *H01L 2224/29111* (2013.01); *H01L 2224/32057* (2013.01); *H01L 2224/32258* (2013.01); *H01L 2224/8114* (2013.01); *H01L 2224/8121* (2013.01); *H01L2224/81385* (2013.01); *H01L 2224/81444* (2013.01); *H01L 2224/81447* (2013.01); *H01L 2224/81815* (2013.01); *H01L 2224/8314* (2013.01); *H01L 2224/8321* (2013.01); *H01L 2224/83385* (2013.01); *H01L 2224/83815* (2013.01); *H01L 2924/12042* (2013.01)

(56) References Cited

U.S. PATENT DOCUMENTS

| | | | |
|---|---|---|---|
| 6,873,032 B1 * | 3/2005 | McCann et al. | H01L 23/3114 257/673 |
| 2014/0084438 A1 * | 3/2014 | Soyano | H01L 24/73 257/676 |

* cited by examiner

ELECTRONIC COMPONENT AND METHOD FOR MANUFACTURING ELECTRONIC COMPONENT

CROSS REFERENCE

The present invention claims priority under 35 U.S.C. §119 to Japanese Application No. 2013-220292 filed Oct. 23, 2013, the entire content of which is incorporated herein by reference.

TECHNICAL FIELD

The present invention is related to an electronic component and a method for manufacturing an electronic component, in particular, related to an electronic component and a method for manufacturing an electronic component capable of simplifying connection assembling between a semiconductor substrate and a plate shape metal member such as a lead terminal piece, or the like.

BACKGROUND ART

As an electronic component of this kind, for example, in addition to an automotive immobilizer, an antenna part for ID certification for performing management of whereabouts of children after school, management of breeding of livestock, management of the entrance and exit at a station, and the like are referred (for example, refer to Patent Literature 1: Japanese Laid-open Patent Application Publication No. S63-208236, Patent Literarature 2: WO 2011/024559 and Patent Literarature 3: Japanese Laid-open Patent Application Publication No. 2001-184471).

The electronic component described in Patent Literature 1 is an IC package, the IC package is made by sealing the surroundings with a resin after connecting a semiconductor substrate (IC chip) and a lead terminal with a wire.

The electronic component described in Patent Literature 2 is a transmitting antenna used in a keyless entry system by which locking and unlocking of a car door can be performed without key operation.

The electronic component described in Patent Literature 3 is an IC tag to be provided on a dish at a conveyor belt sushi shop.

Meanwhile, such an electronic component is generally configured with a passive component, an IC chip composed of a semiconductor substrate, a base member for mounting the passive component and the IC chip, and the like.

Such an IC package is configured with a semiconductor substrate (IC chip) to be sealed in the package, a lead frame having a lead derived from the package, a bonding wire of gold connected between a conductive pattern (land) provided to the semiconductor substrate in the package and the lead frame, and the like.

However, with regard to providing a bonding wire of gold between the lead frame and the land of the semiconductor substrate, in an electronic component such as a conventional IC package or the like, there were problems that it costed very high and the workability was poor due to a lot of working man-hours.

CITATION LIST

Patent Literature

Patent Literarature 1. Japanese Laid-open Patent Application Publication No. S63-208236 (refer to FIG. 1)

Patent Literarature 2. WO 2011/024559
Patent Literarature 3. Japanese Laid-open Patent Application Publication No. 2001-184471

SUMMARY OF INVENTION

Technical Problem

Accordingly, the present invention has been made in view of the above described problems, it is an object of the present invention to provide an electronic component and a method for manufacturing an electronic component capable of simplifying connection assembling between a semiconductor substrate and a plate shape metal member such as a lead terminal piece, or the like and of reducing cost.

Solution to Problem

The present invention has been proposed in order to achieve the above described object. An aspect according to the present invention shall be understood by the structure described below.

(1) A first aspect according to the present invention is an electronic component comprising: a resin frame; a semiconductor substrate housed in the resin frame; a plate shape metal member having at least one end fixed in the resin frame at a position spaced apart from the semiconductor substrate; an electrical connection region portion formed on the surface on the side of the plate shape metal member of the semiconductor substrate with an electrically conductive material; and a solder layer formed on the surface on the side of the plate shape metal member of the electrical connection region portion, wherein the plate shape metal member supports the semiconductor substrate without contact through the solder layer and the electrical connection region portion, and is electrically connected to the electrical connection region portion.

(2) In the abobe described (1), the plate shape metal member may have in a region connected to the solder layer a bent portion projecting toward the solder layer.

(3) In the above described (1) or (2), the resin frame may have a hollow portion housing the semiconductor substrate therein, and the plate shape metal member may be electrically connected to the semiconductor substrate in the hollow portion.

(4) In any of the above described (1) to (3), the plate shape metal member may be embedded and fixed in the resin frame at one end side, and may be opened or embedded to be fixed in the resin frame at the other end side.

(5) In any of the above described (1) to (4), the plate shape metal member may comprise a copper alloy or a stainless steel having a Vickers hardness of 50 Hv or more to 300 Hv or less.

(6) In any of the above described (3) to (5), the resin frame may have a projecting portion extending to the hollow portion, the projecting portion having a contact portion positioning the semiconductor substrate in contact with the at least one portion of the semiconductor substrate.

(7) A second aspect according to the present invention is a method for manufacturing an electronic component, comprising: an insert molding step of forming a resin frame so as to embed at least one end of a plate shape metal member therein, by injecting a resin in a mold with positioning the plate shape metal member in the mold; a semiconductor substrate preparation step of providing a semiconductor substrate having an electrical connection region portion formed with a conductive material and a solder layer on the surface in this order; a semiconductor substrate placing step of allowing the semiconductor substrate to be placed on the plate shape metal member by the self weight, thereby the solder layer and a portion of the plate shape metal member becoming to be in contact, having a downward facing surface having the solder layer of the semiconductor substrate; and a reflow soldering step of dissolving the solder layer by applying heat to the solder layer, and electrically connecting the semiconductor substrate and the plate shape metal member.

Advantageous Effects of Invention

According to the present invention, an electronic component and a method for manufacturing an electronic component capable of simplifying connection assembling between a semiconductor substrate and a plate shape metal member such as a lead terminal piece, or the like and of reducing cost can be provided.

DESCRIPTION OF EMBODIMENT

Hereinafter, an embodiment of an electronic component according to the present invention shall be described in detail with reference to drawings. Note that the present invention is not limited by this embodiment.

Figure 1:
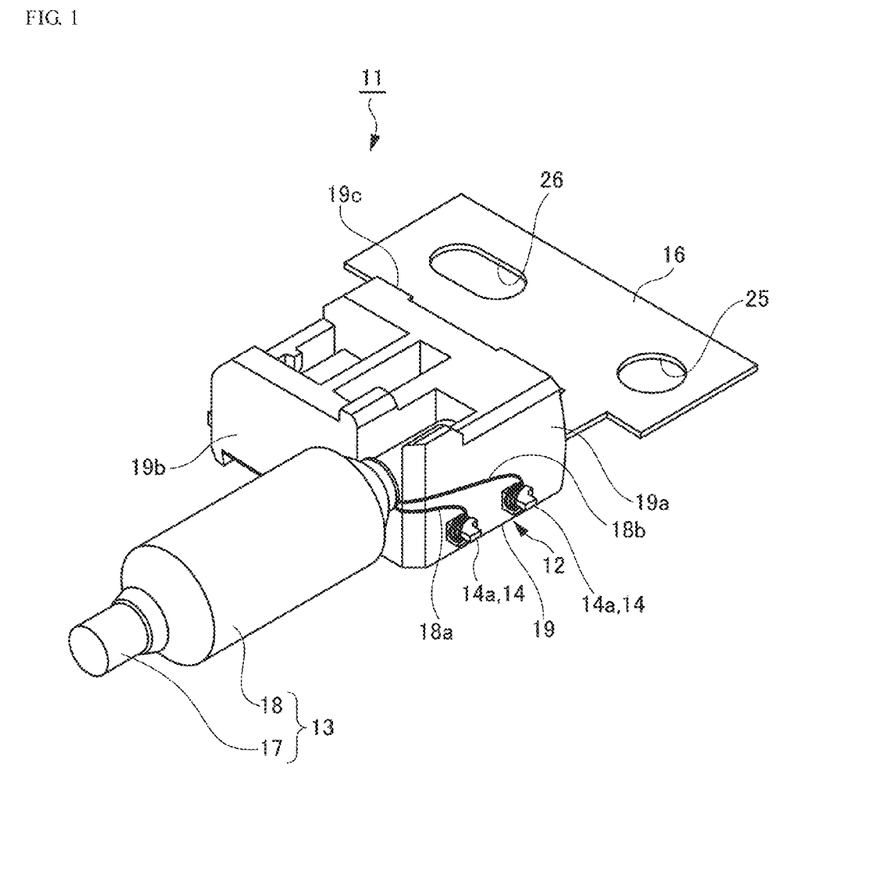
FIG. 1 is a perspective view (seen from an upper surface side of an antenna unit) of an antenna unit illustrating an embodiment of an electronic component according to the present invention.
Figure 2:
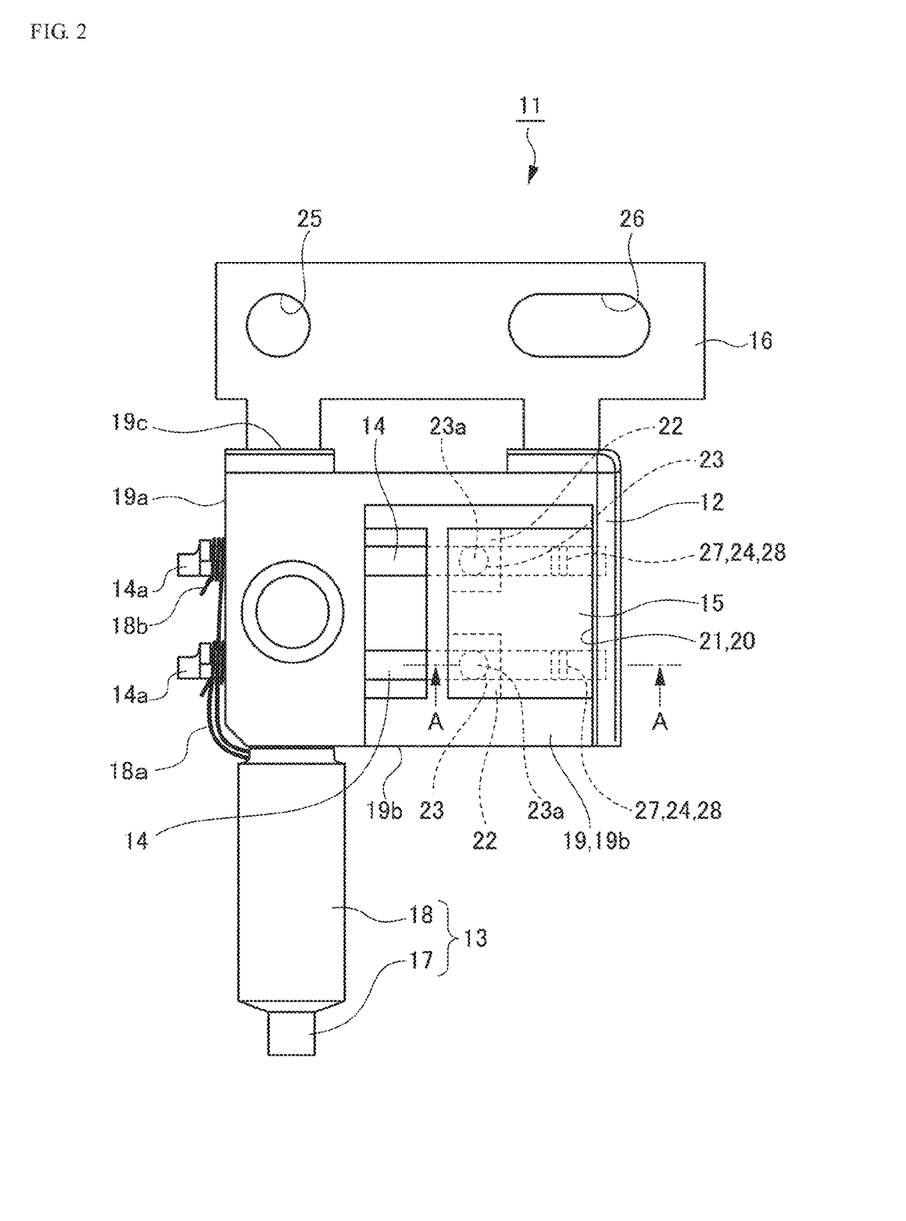
FIG. 2 is a diagram for explaining the configuration of the above described antenna unit, and is a view seen from the lower surface.

FIG. 1 to FIG. 4 illustrate an embodiment of an electronic component according to the present invention. An antenna unit 11 as one example of the electronic component shall be described. As illustrated in FIG. 1 and FIG. 2, an antenna unit 11 is provided with a unit body 12, an antenna coil 13 attached to the unit body 12, semiconductor substrate 15, a pair of plate shape metal members 14, 14 spaced apart from the semiconductor substrate 15, and a mounting plate 16, and the like.

The antenna coil 13 is made of a rod-like core 17, and a coil 18 wound with a winding wire by a predetermined number of turns through an insulation sheet material (not illustrated) on a periphery surface of the rod-like core 17. The coil 18 is provided with lead wires 18a, 18b from the winding.

The unit body 12 is provided with a resin frame 19 formed to a predetermined shape by injecting a resin material into a mold (not illustrated). In addition, when molding the resin frame 19, the so-called insert molding is carried out in which a pair of plate shape metal members 14, 14 and a mounting plate 16 are placed respectively at a predetermined position in the mold, and in the state, the pair of plate shape metal members 14, 14 and the mounting plate 16 are embedded by injecting a resin material into the mold, and the resin frame 19 is integrated with the pair of plate shape metal members 14, 14 and the mounting plate 16.

Each plate shape metal member 14 has a function as a lead terminal piece, and is formed by pressing a sheet material of a metal having elasticity with a strength and a hardness to some extent, such as a copper alloy, a stainless steel or the like. Here, in the present example, from the viewpoint of convenience of manufacturing and cost reduction, it is preferable that the plate shape metal member 14 is formed with the same material as the material of a lead frame to be used in the semiconductor substrate 15. In particular, in order that the plate shape metal member 14 plays a role of supporting the plate shape metal member 14 in a manner to be described later, a metal material having a predetermined hardness is preferable. The hardness of the plate shape metal member 14 used in the present example is 50 Hv or more and 300 Hv or less, in Vickers hardness.

Each one end side of the plate shape metal members 14, 14 is projected to the outside from one side surface 19a of the resin frame 19 as connection terminals 14a, 14a, as illustrated in FIG. 1 and FIG. 2. To each of the connection terminals 14a, 14a, each of the lead lines 18a, 18b of the coil 18 in the antenna coil 13 is bound and connected electrically and mechanically. Here, the rod-like core 17 of the antenna coil 13 is attached to a front surface 19b of the resin frame 19, by fixing one end side.

Figure 3:
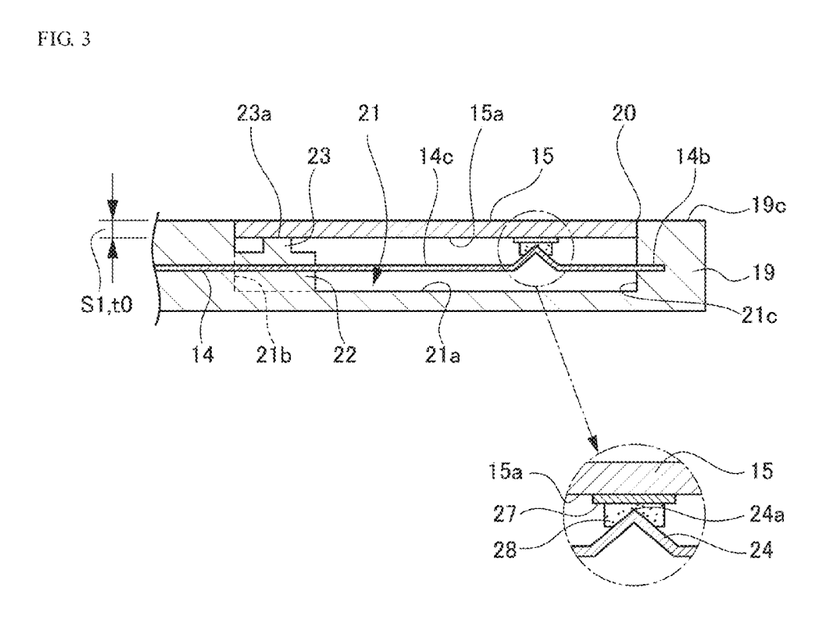
FIG. 3 is an enlarged cross-sectional view taken along a line A-A of FIG. 2.
Figure 4:
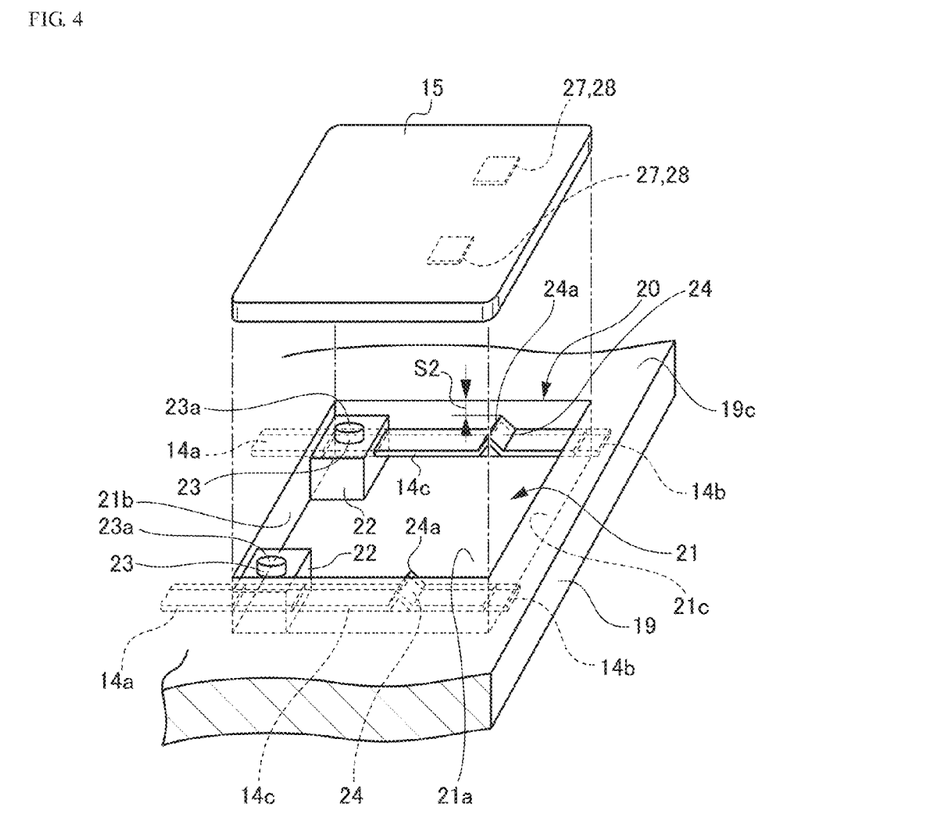
FIG. 4 is an exploded perspective view explaining a structure in a hollow portion of above described antenna unit and a configuration of a semiconductor substrate to be housed in the hollow portion.

Further, as illustrated in FIG. 2, on a back surface (lower surface 19c) side of the resin frame 19, a hollow portion 21 having an opening 20 is formed. In the hollow portion 21, as illustrated in FIG. 2 to FIG. 4, the semiconductor substrate 15 can be housed by arranging in a plane. Therefore, the hollow portion 21 in the present example is formed in a size of the opening 20 being about the same as the plane of the square shaped semiconductor substrate 15, and in a depth of a recess being deeper than the thickness of the semiconductor substrate 15.

Further, as illustrated in FIG. 4, in a bottom surface 21a of the hollow portion 21, at the two corner portions on an inner side surface 21b in a side where connection terminals 14a, 14a of the plate shape metal members 14, 14 are provided, of the two inner side surfaces 21b, 21c where each of the two plate shape metal members 14, 14 is disposed through, each of a base 22 provided in a projected state toward the opening 20 from the bottom surface 21a, and a projecting portion 23 formed on the base 22, are provided integrally. Here, as illustrated in FIG. 3, a distance S1 between an upper surface 23a of the projecting portion 23 and the opening 20 is formed in substantially the same as a thickness t0 of the semiconductor substrate 15 (the thickness t0 is not included in thicknesses of a pad 27 and a solder layer 28 to be described later). In addition, the hollow portion 21 does not need necessarily to be formed into a bottomed shape provided with the bottom surface 21a, and can be formed as a hole penetrating vertically.

In the hollow portion 21, at each position corresponding to the bases 22, 22, intermediate portions 14c, 14c of the plate shape metal members 14, 14 are disposed so as to cross in the right and left direction in the hollow portion 21, in a state where the other ends 14b, 14b at the sides opposite to the connection terminals 14a, 14a are embedded in the resin frame 19. Further, as illustrated in FIG. 2 and FIG. 3, in the intermediate portions 14c, 14c disposed in the hollow portion 21, a bent portion 24 formed in a curve having a cross-section of an inverse V-shaped form is formed so as to project in a direction where the semiconductor substrate 15 is coming to be housed in the sides of the other ends 14b, 14b, spaced apart from the projecting portion 23, that is, a direction projecting toward the side of the opening 20 in the present example. In addition, as illustrated in FIG. 4, a distance S2 from a top 24a of the bent portion 24 to the surface of the opening 20 is formed slightly larger than a thickness t1 of the semiconductor substrate 15 illustrated in FIG. 6A (the thickness t1 includes the thickness t0 of the semiconductor substrate 15 and the thickness of the pad 27 to be described later). Here, an aspect where the sides of the other ends 14b, 14b are embedded in the resin frame 19 is illustrated, but without being limited to this, as described later in a first modification example 1, a cantilevered plate shape metal member 14 may be possible where only the sides of the one ends 14a, 14a of the plate shape metal member 14 are fixed, and the sides of the other ends 14b, 14b are opened, that is, free.

The mounting plate 16 is, for example, used when mounting the antenna unit 11 in a door handle that employs a keyless entry system that performs locking and unlocking of the door of an automobile or the like without key operation. As illustrated in FIG. 1 and FIG. 2, mounting holes 25, 26 into which a mounting screw (not illustrated) or the like is inserted are provided in the other end side 14b which is led out from a back surface 19c of the resin frame 19, while the one end side 14b is embedded in the resin frame 19 and attached.

The semiconductor substrate 15, is composed of a semiconductor material such as a single crystal, a polycrystalline Si substrate, a SiC substrate, a GaN substrate, or the like, in the present example, and a multi-layer integrated circuit is formed therein. Further, on the side of the surface to be mounted toward the bottom surface 21a of the hollow portion 21 (the lower surface 15a), as illustrated in FIG. 2 to FIG. 5, a pair of pads 27, 27 as an electrical connection region portion are formed corresponding to each of the bent portion 24 of the plate shape metal members 14, 14. The pads 27,27 are generally composed of an alloy or a compound having good compatibility with both a metal and a semiconductor, and is formed with a conductive material capable of conducting electricity. Further, on the surface of the pads 27, 27, a creamy solder layer 28 composed primarily of tin is formed. Note that here, so that scratches to the semiconductor substrate 15 are not caused by the plate shape metal member 14, it is preferable that a height of the solder layer 28 is 5 times or more and 20 times or less of the height of the pad 27. In the present example, the height of the pad 27 is about 0.008 mm and the total height of the pad 27 and the solder layer 28 is 0.06 mm or more and 0.10 mm or less.

And, the semiconductor substrate 15 is dropped into the hollow portion 21 of the resin frame 19 such that the surface having the pad 27 provided with the solder layer 28 faces down, and is housed in the hollow portion 21 so as to be burried therein. Then, the solder layer 28 and the pad 27 correspond to the bent portions 24, 24 of the plate shape metal members 14, 14, respectively, and the projecting portions 23, 23 in the hollow portion 21 contact with the lower surface 15a of the semiconductor substrate 15. And, the semiconductor substrate 15 is supported by a very small force (corresponding to the self weight of the semiconductor substrate 15) in the projecting portions 23, 23 and the bent portions 24, 24 of the plate shape metal members 14, 14 in the hollow portion 21. Further, in this state, the solder layer 28 is melt by placing the antenna unit 11 in a reflow furnace (not illustrated) and flowing hot air, and then the solder layer 28 is cooled and solidified, and the semiconductor substrate 15 and the plate shape metal member 14 are integrated.

Figure 6A:
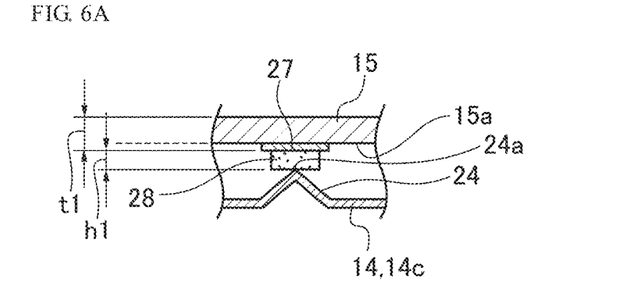
FIG. 6A is a phase diagram before reflow soldering for explaining a solder connection in the present embodiment.
Figure 6B:
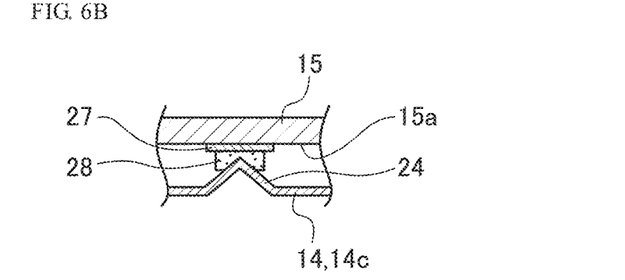
FIG. 6B is a phase diagram after reflow soldering for explaining the solder connection in the present embodiment.

Meanwhile, before reflow soldering, due to the self weight of the semiconductor substrate 15, the plate shape metal member 14 comes to enter the solder layer 28, but since the weight of the semiconductor substrate 15 is light, as illustrated in FIG. 6B, the plate shape metal member 14 does not enter the solder layer 28 up to the state where the bent portion 24 contacts with the pad 27, and the pad 27 and the bent portion 24 are, as illustrated in FIG. 6B, in non-contact state even after reflow sodering and do not contact directly. In other words, even during reflow soldering, the solder of the solder layer 28 melts, but since the self weight of the semiconductor substrate 15 is light, the bent portion 24 of the plate shape metal member 14 does not break through the solder layer and does not contact with the pad 27 directly. At this time, of course, the plate shape metal member 14 does not contact with the surface of the semiconductor substrate 15. Note that, in a form other than the form illustrated in FIG. 6B, it may be possible that the plate shape metal member 14 breaks through the solder layer 28 and contacts with the pad 27 in a extent where the pad 27 is not broken through. In brief, as far as the plate shape metal member 14 and the semiconductor substrate 15 are not damaged, various kinds of modifications can be applied.

Further, though it is not illustrated, the whole antenna unit 11 formed in this way, except the mounting portion of the mounting plate 16, is sealed with a resin and is completed.

Figure 5:
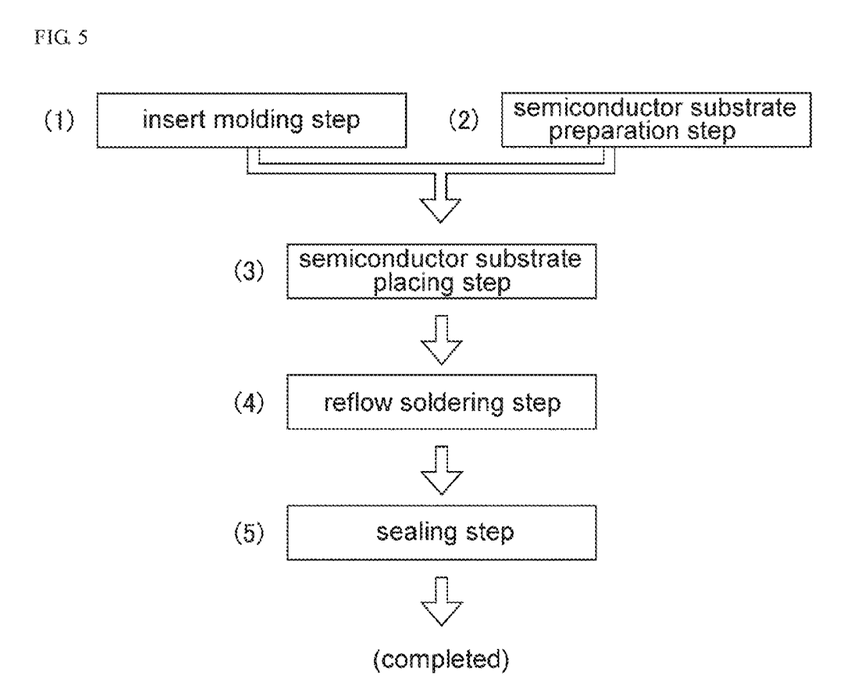
FIG. 5 is a diagram explaining one example of a method for manufacturing an electronic component of the present invention.

FIG. 5 is a block diagram illustrating one example of manufacturing steps of the antenna 11. With reference to FIG. 5, the manufacturing steps of the antenna 11 are explained in the order of (1) to (5).

(1) In an insert molding step, a pair of plate shape metal members 14, 14 and a mounting plate 16 are placed at a predetermined position in the mold respectively, and in the state, a resin material is injected into the mold so that the plate shape metal members 14, 14 and the mounting plate 16 are embedded in the resin, that is, a so-called insert molding is performed, and a resin frame 19 is formed.

(2) In a semiconductor substrate preparation step, a semiconductor substrate having a pad 27 as an electrical connection region portion formed with a conductive material and having a creamy solder layer 28 composed primarily of tin on the surface of the pad 27, is prepared.

(3) In a semiconductor substrate placing step, the surface having the solder layer 28 is faced down, the semiconductor substrate 15 is dropped into the hollow portion 21 by the self weight so that the solder layer 28 and a top 24a of a bent portion 24 which is a part of the plate shape metal member 14, and the semiconductor substrate 15 is placed on the plate shape metal member 14. Therefore, by the self weight of the semiconductor substrate 15, the bent portion 24 of the plate shape metal member 14 comes to enter the solder layer 28, but since the weigt of the semiconductor substrate 15 is light, the bent portion 24 of the plate shape metal member 14 does not contact with the surface of the pad 27 to the semiconductor substrate 15 directly. FIG. 6A illustrates a state before the reflow. In addition, by placing the semiconductor substrate 15 after applying a flux treatment to the bent portion 24 of the plate shape metal member 14, further reliable bonding becomes possible.

(4) In the reflow soldering step, an antenna 11 is placed in a reflow furnace, hot air is supplied, the solder layer 28 is melt, and the the semiconductor substrate 15 and the plate shape metal member 14 are integrated. At this time, the solder melts and flows around the bent portion 24 of the plate shape metal member 14, and sometimes also intrude the recess of the bent portion 24 of the plate shape metal member 14. FIG. 6A illustrates a state before the reflow soldering treatment, and FIG. 6B illustrates a state after the reflow soldering treatment. In addition, with regard to the reflow soldering treatment, besides placing in a reflow furnace, a spot reflow device may be used, or a treatment of melting the solder layer 28 with a laser may be applied.

(5) In a sealing step, almost the whole antenna unit 11, except the mounting portion of the mounting plate 16, is sealed with a resin and the antenna unit 11 is completed. Here, the antenna unit 11 illustrated in FIG. 1 to FIG. 3 is represented in a state before sealing with the resin. That is, the antenna unit 11 may be used without being sealed with a resin.

Thus, in the antenna unit 11 which is an electronic component formed in this way, when assembling the plate shape metal member 14 and the semiconductor substrate 15, the plate shape metal member 14 supports the semiconductor substrate 15 through the solder layer 28 provided on the surface of the pad 27 which is an electrical connection region portion formed on the surface of the semiconductor substrate 15, and when the solder layer 28 is melt in this state, a part of the melted solder layer 28 flows in between the plate shape metal member 14 and the pad 27, and the plate shape metal member 14 and the semiconductor substrate 15 are electrically connected.

Further, in the plate shape metal member 14, in the region connecting the semiconductor substrate 15 to the solder layer 28, a bent portion 24 curved so as to project toward the solder layer 28 is provided, and so when the semiconductor substrate 15 is disposed in the hollow portion 21, a part of the bent portion 24 easily intrudes into the solder layer 28. In addition, when the solder layer 28 melts, the solder layer 28 enters the surroundings of the projected bent portion 24, the melted solder flows around the bent portion 24, stable electrical connection and fixation can be realized between the plate shape metal member 14 and the semiconductor substrate 15.

Further, the resin frame 19 has a hollow portion 21 for housing the semiconductor substrate 15, and the semiconductor substrate 15 is electrically connected to the plate shape metal member 14 in the hollow portion 21 where the semiconductor substrate 15 is housed and arranged therein, and so positioning of the semiconductor substrate 15 to the resin frame 19 is easy, and electrical connection and fixation between the plate shape metal member 14 and the semiconductor substrate 15 can be performed stably.

Figure 7A:
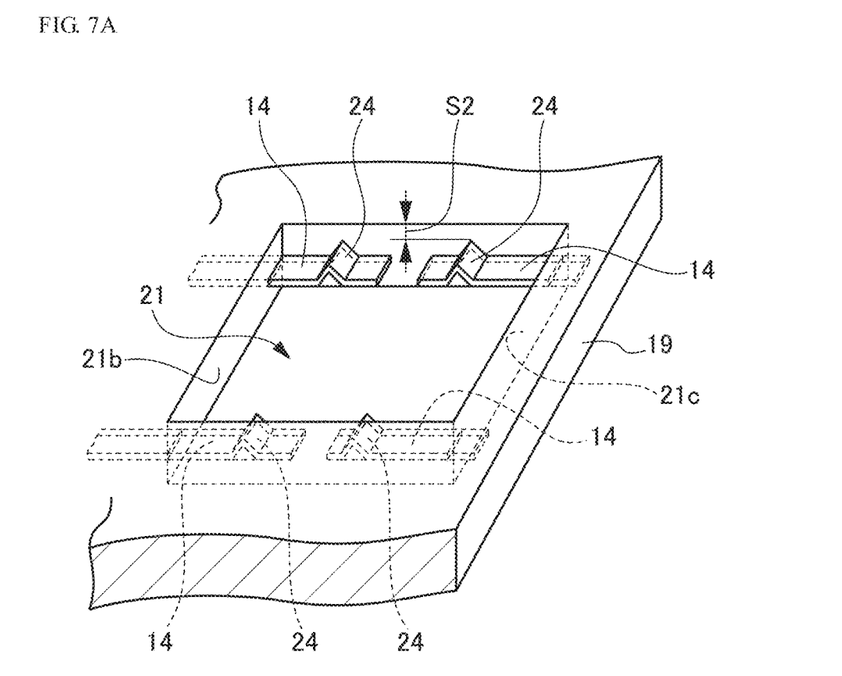
FIG. 7A is an explanatory diagram of a structure of a resin frame side explaining a first modification example of the electronic component of the present invention.

Note that the present invention can be modified and carried out as illustrated in FIG. 7. As illustrated in FIG. 7A, a first modification example has a structure provided with four pieces of plate shape metal members 14 in a cantilever where each two pieces among the four pieces extend each from inner side surfaces 21b, 21c at the right and the left of the hollow portion 21. Further, at the free end sides of the four pieces of the plate shape metal members 14 extending in the hollow portion 21, a bent portion 24 formed in a curve having a cross-section of an inverse V-shaped form so as to project in a direction where the semiconductor substrate 15 is coming to be housed, that is, a direction projecting toward the side of the opening 20 (semiconductor layer described later), is provided respectively. In addition, a distance S2 from a top 24a of the bent portion 24 to the opening 20 is formed slightly larger than the thickness t1 of the semiconductor substrate 15.

Figure 7B:
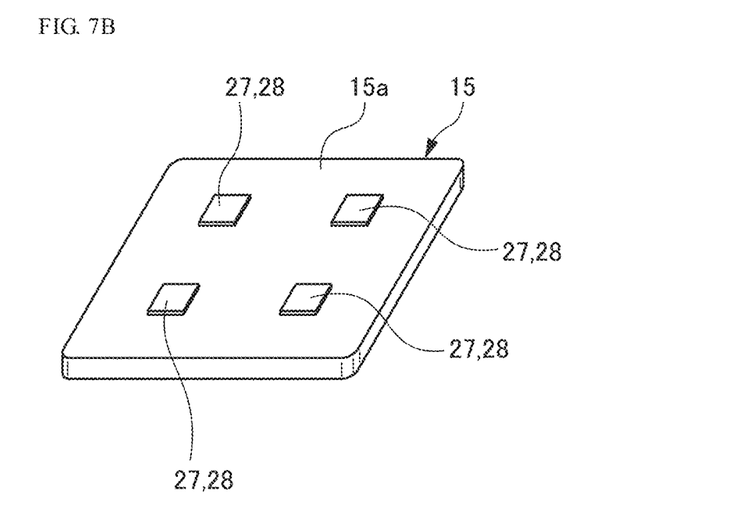
FIG. 7B is an explanatory diagram of a structure of a back surface side of the semiconductor substrate explaining the first modification of the electronic component of the present invention.

On the other hand, the semiconductor substrate 15 to be housed in the hollow portion 21 is, as illustrated in FIG. 7B, provided with a pad 27 having a solder layer 28 in positions corresponding to the four pieces of the bent portions 24 of the plate shape metal member 14.

And, in this example, the semiconductor substrate 15 is dropped into the hollow portion 21 of the resin frame 19 and housed in the hollow portion 21 in a state embedded therein, so that a surface (lower surface 15a) provided with the pad 27 having the solder layer 28 faces down. Then, the solder layer 28 and the pad 27 come to correspond to the bent portion 24 of the plate shape metal member 14 respectively, and the bent portion 24 contacts the lower surface 15a of the semiconductor substrate 15 through the solder layer 28 and the pad 27. And, the semiconductor substrate 15 is supported by the bent portions of the four pieces of the plate shape metal members 14 in the hollow portion 21. Further, in this state, the antenna 11 is placed in a reflow furnace (not illustrated), hot air is supplied and the solder layer 28 is melt, and then the solder layer 28 is cooled and solidified, and the semiconductor substrate 15 and the plate shape metal member 14 are electrically and mechanically fixed.

In this example, the base 22 and the projecting portion 23 having been provided in the above described embodiment are omitted, and instead, by supporting the semiconductor substrate 15 with the bent portions 24 provided to the four pieces of the plate shape metal members 14, the semiconductor substrate 15 can be electrically and mechanically fixed. In addition, two pieces of the plate shape metal members 14 are allowed to connect to lead lines 18a, 18b of a coil 18, and the remaining two pieces of the plate shape metal members 14 may be connected to another electric circuit and used.

Figure 8A:
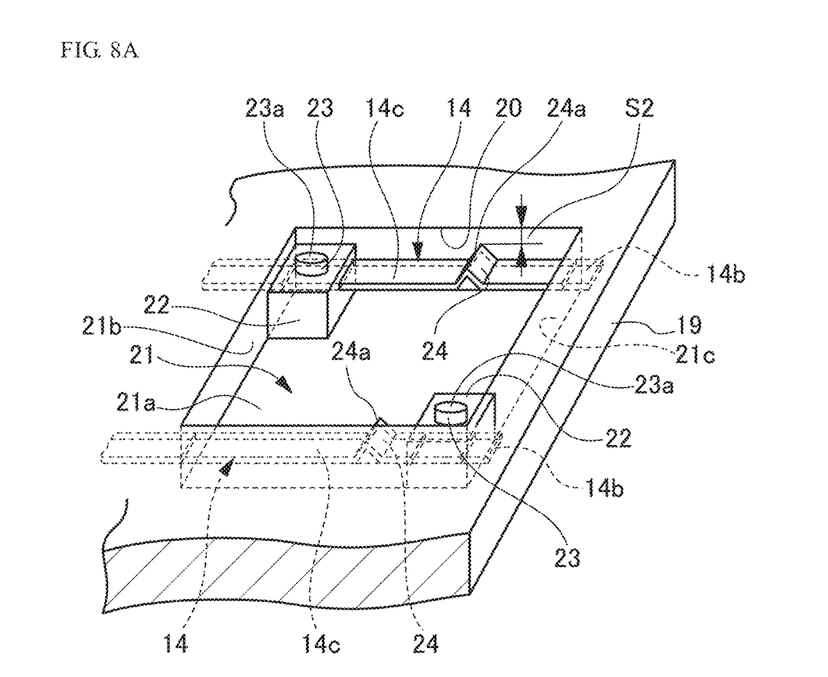
FIG. 8A is an explanatory diagram of a structure of a resin frame side explaining a second modification example of the electronic component of the present invention.

Further, the present invention can be modified and carried out as illustrated in FIG. 8. A second modification example is, as illustrated in FIG. 8A, provided integrally with, at two corners connected by a diagonal of a hollow portion 21, bases 22 projecting each toward an opening 20 from a bottom surface 21a and projecting portions 23 formed on the bases 22. In this case, a distance S2 between the projecting portion 23 and the opening 20 is also formed to substantially the same as the thickness t0 of the semiconductor substrate 15. Further, the plate shape metal members 14, 14 are disposed in a state where the intermediate portions 14c, 14c cross in the right and left direction in the hollow portion 21, and the other ends 14b, 14b at the sides opposite to the connection terminals 14a, 14a are embedded in the resin frame 19, at a position where the base 22 is provided. Further, in the intermediate portions 14c, 14c disposed in the hollow portion 21, a bent portion 24 formed in a curve having a cross-section of an inverse V-shaped form is formed so as to project in a direction where the semiconductor substrate 15 is coming to be housed, that is, a direction projecting toward the side of the opening 20 (in other words, the side of the solder layer 28 of the semiconductor substrate 15) in the present example. The bent portions 24 are provided respectively at positions symmetrical to each other apart from the base 22 by a predetermined distance. In addition, a distance S2 from the top 24a of the bent portion 24 to the opening 20 is formed slightly larger than the thickness t1 of the semiconductor substrate 15.

Figure 8B:
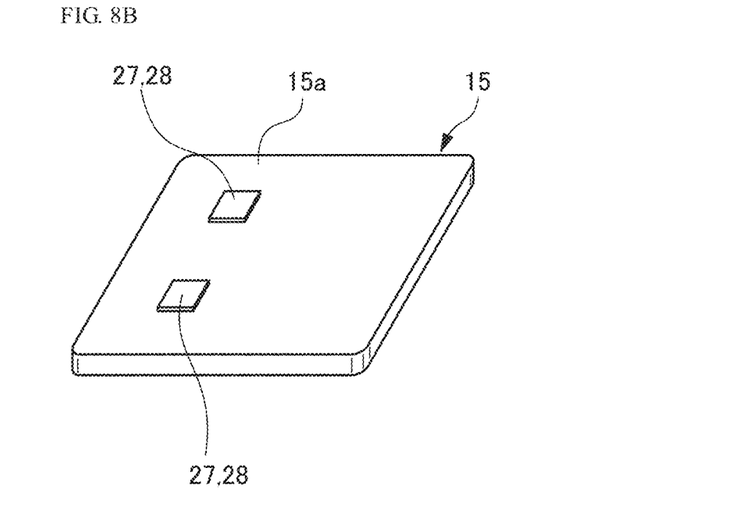
FIG. 8B is an explanatory diagram of a structure of a back surface side of the semiconductor substrate explaining a second modification example of the electronic component of the present invention.

On the other hand, the semiconductor substrate 15 to be housed in the hollow portion 21, as illustrated in FIG. 8B, is provided with the pad 27 having the solder layer 28, at positions corresponding to the bent portions 24 of the two pieces of the plate shape metal members 14, respectively.

And, also in this example, the semiconductor substrate 15 is dropped into the hollow portion 21 of the resin frame 19 and housed in the hollow portion 21 in a state embedded therein, so that a surface (lower surface 15a) provided with the pad 27 having the solder layer 28 faces down. Then, the solder layer 28 and the pad 27 come to correspond to the bent portion 24 of the plate shape metal member 14 respectively, and the bent portion 24 contacts the lower surface 15a of the semiconductor substrate 15 through the solder layer 28 and the pad 27. And, the semiconductor substrate 15 is supported by the bent portions of the four pieces of the plate shape metal members 14 in the hollow portion 21. Further, in this state, the antenna 11 is placed in a reflow furnace (not illustrated), hot air is supplied and the solder layer 28 is melt, and then the solder layer 28 is cooled and solidified, and the semiconductor substrate 15 and the plate shape metal member 14 are electrically and mechanically fixed.

Figure 9:
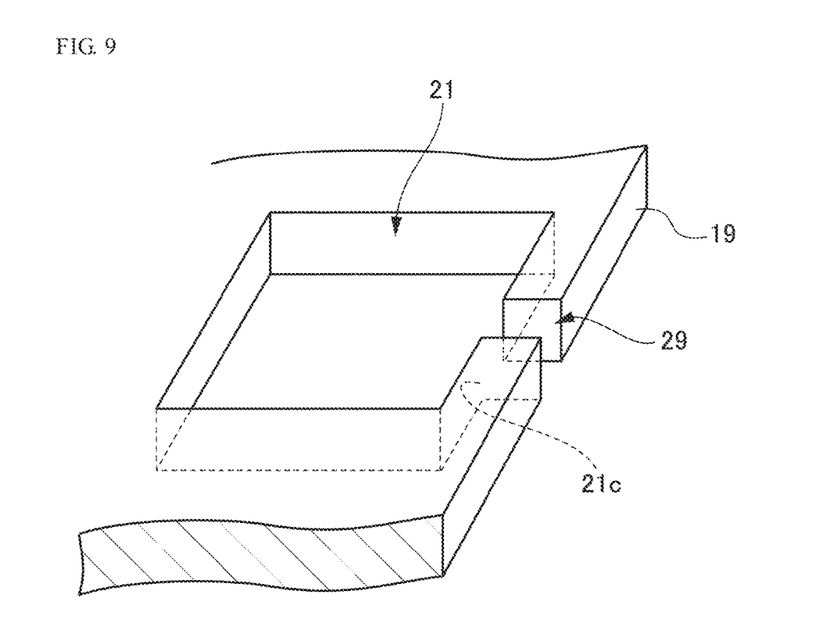
FIG. 9 is a diagram explaining a third modification example according to a hollow portion of a resin frame in the electronic component of the present invention.

FIG. 9 illustrates a third modification according to the hollow portion 21. In the hollow portions 21 illustrated in FIG. 2 to FIG. 8, a structure is disclosed where four inner side surfaces are formed as a continuing recess without interruption, but in the hollow portions 21 illustrated in FIG. 9, a structure is taken where one inner side surface is provided with a notch portion 29 leading to an outer side surface. With such a structure, even when the size of the opening 20 of the hollow portion 21 is smaller than the area of the semiconductor substrate 15, the opening 20 spreads due to the notch portion 29, an error and the like with the semiconductor substrate 15 can be absorbed. Further, the thermal expansion of the semiconductor substrate 15 and the resin frame 19 can be absorbed.

FIG. 10 illustrates a plurality of modification examples of a bent portion 24 to be provided in the plate shape metal member 14.

Figure 10A:
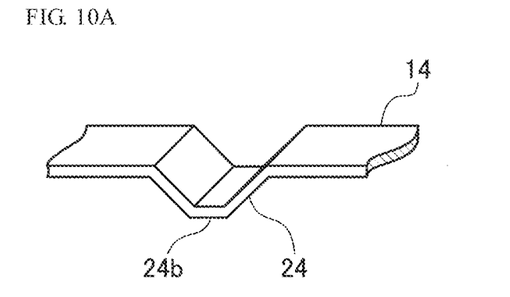
FIG. 10A is a diagram explaining a fourth modification example of a bent portion of a plate shape metal member in the electronic component of the present invention.

FIG. 10A is a fourth modification example, where a V-shaped ceiling portion 24b forming the bent portion 24 is formed in a plane, and the ceiling portion 24b contacts to the solder layer 28 with the plane. In this configuration, a time for the bent portion 24 to intrude the solder layer 28 can be adjusted so as to be delayed.

Figure 10B:
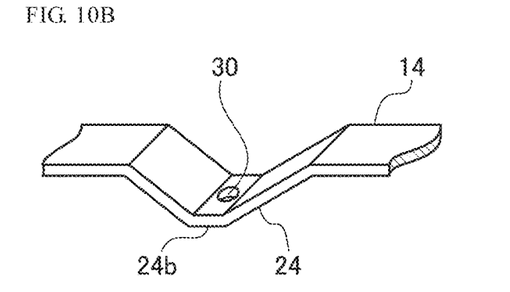
FIG. 10B is a diagram explaining a fifth modification example of a bent portion of a plate shape metal member in the electronic component of the present invention.

FIG. 10B is a fifth modification example, a modified version of FIG. 10A, where a through hole 30 in a vertical direction is provided in the ceiling portion 24b. In this configuration, the melted solder layer 28 enters the through hole 30, and integration with the bent portion 24 can be achieved.

Figure 10C:
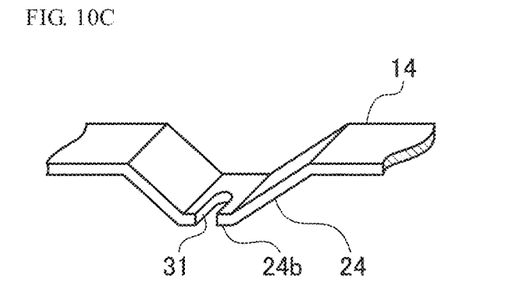
FIG. 10C is a diagram explaining a sixth modification example of a bent portion of a plate shape metal member in the electronic component of the present invention.

FIG. 10C is a sixth modification example, also a modified version of FIG. 10A, where the ceiling portion 24b is provided with a notch portion 31 penetrating in a vertical direction. Also in this configuration, the melted solder layer 28 enters the notch portion 31, and integration with the bent portion 24 can be achieved.

Figure 10D:
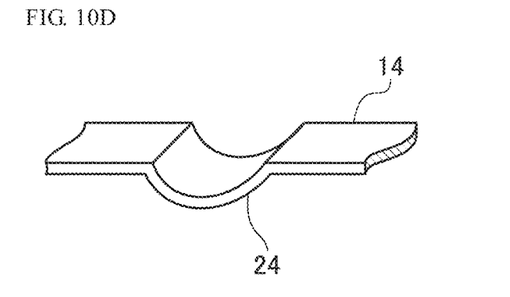
FIG. 10D is a diagram explaining a seventh modification example of a bent portion of a plate shape metal member in the electronic component of the present invention.

FIG. 10D is a seventh modification example, where the bent portion 24 is formed in a curved surface of a bow-shape, and contacts to the solder layer 28 with the curved surface. Also in this configuration, a time for the bent portion 24 to intrude the solder layer 28 can be adjusted so as to be delayed.

In addition, in the embodiment, in the reflow soldering step, it is disclosed that the bent portion 24 intrudes into the melted solder layer 28 by the self weight of the semiconductor substrate 15 and a connection is performed, but on the contrary, the connection can be performed using the self weight of the resin frame 19. In addition, the connection of the semiconductor substrate 15 and the plate shape metal member 14 may be performed using a method such as Flip-Chip. In this case, it is necessary to apply a special plating, for example, a thick layer plating of Au or Cu in advance to the plate shape metal member 14.

According to the electronic component according to the above embodiment, when assembling the plate shape metal member and the semiconductor substrate, the plate shape metal member supports the semiconductor substrate through the solder layer provided to the electrical connection region portion such as the pad and the like formed on the surface of the semiconductor substrate, and in this state, the solder layer is melted. Then, a part of the melted solder layer flows in between the plate shape metal member and the electrical connection region portion, an electrical connection is made between the plate shape metal member and the semiconductor substrate. Further, then, by solidifying the solder layer, an electronic component can be easily obtained where the plate shape metal member and the electrical connection region portion are are connected and fixed electrically and mechanically with each other.

In the case the plate shape metal member is provided with a bent portion, when the solder layer is melted, the bent portion projecting toward the solder layer enters the solder layer and the melted solder flows around the bent portion, and after the solder layer has solidified, stable electrical connection and fixation can be realized between the plate shape metal member and the semiconductor substrate.

In the case the resin frame has a hollow portion for housing the semiconductor substrate, when the semiconductor substrate is housed and disposed in the hollow portion of the resin frame, the semiconductor substrate is positioned in the resin frame, and electrical connection and fixation between the plate shape metal member and the semiconductor substrate can be made stably. In the plate shape metal member, while one end side is embedded and fixed in the resin frame, the other end side may be either opened or embedded and fixed in the resin frame, and either of the ways can be selected depending on the installation location and the application of the electronic component. In the case the other end side is opened as a free end, when the electronic component is installed in a vehicle and the like, it is possible to relieve stress due to vibrations of the vehicle body and the like.

In the case the plate shape metal member includes a copper alloy or a stainless steel and the Vickers hardness thereof is 50 Hv or more and 300 Hv or less, by supporting the semiconductor substrate using such the plate shape metal member, the plate shape metal member can support the semiconductor substrate stably. Thus, electrical connection and fixation between the plate shape metal member and the semiconductor substrate can be made stably.

In the case the resin frame has a projecting portion extending in the hollow portion, a positioning contact portion and the plate shape metal member can stably support the semiconductor substrate housed and disposed in the hollow portion, and further, electrical connection and fixation between the plate shape metal member and the semiconductor substrate can be made stably.

According to the method of manufacturing an electronic component according to the above embodiment, in the the insert molding step, the resin frame having one end of the plate shape metal member embedded therein is formed, and in the semiconductor substrate preparation step, the semiconductor substrate having the electrical connection region portion on the surface and having the solder layer on the surface of the electrical connection region portion is provided, and in the semiconductor substrate placing step, the semiconductor substrate is placed by the self weight on the plate shape metal member, the surface of the semiconductor substrate having the solder layer faces down, and the solder layer and a part of the late shape metal member are in contact, and then, in the reflow soldering step, when the solder layer is melted with heat, while the semiconductor substrate drops by the self weight, a part of the solder flows in between the plate shape metal member and the electrical connection region portion, and electrical connection is made between the plate shape metal member and the electrical connection region portion of the semiconductor. Further, then, when the sloder layer is solidified, an electronic component can be easily obtained where the plate shape metal member and the electrical connection region portion are electrically and mechanically connected each other.

REFERENCE SIGNS LIST

11 . . . antenna unit (electronic part); 12 . . . unit body; 13 . . . antenna coil; 14 . . . plate shape metal member; 14a . . . connection terminal (one end side); 14b . . . other end side; 14c . . . intermediate portion; 15 . . . semiconductor substrate; 15a . . . lower surface; 16 . . . mounting plate; 17 . . . rod-like core; 18 . . . coil; 18a, 18b . . . lead line; 19 . . . resin frame 19a . . . side surface; 19b . . . front surface; 19c . . . lower surface; 20 . . . opening; 21 . . . hollow portion; 21a . . . bottom surface; 21b . . . inner side surface; 22 . . . base; 23 . . . projecting portion; 23a . . . top surface of projecting portion (contact portion); 24 . . . bent portion; 24a . . . top; 24b . . . ceiling portion; 25, 26 . . . mounting hole; 27 . . . pad (electrical connection region portion); 28 . . . solder layer; 29 . . . notch portion; 30 . . . through hole; 31 . . . notch portion; S1 . . . distance; S2 . . . distance; t0, t1 . . . thickness of semiconductor substrate; h . . . height of solder layer

The invention claimed is:

1. An electronic component comprising:
   a resin frame;
   a semiconductor substrate housed in the resin frame;
   a plate shape metal member having at least one end fixed in the resin frame at a position spaced apart from the semiconductor substrate;
   an electrical connection region portion formed on the surface on the side of the plate shape metal member of the semiconductor substrate with an electrically conductive material; and
   a solder layer formed on the surface on the side of the plate shape metal member of the electrical connection region portion,
   wherein the plate shape metal member supports the semiconductor substrate without contact through the solder layer and the electrical connection region portion, and is electrically connected to the electrical connection region portion.

2. The electronic component according to claim 1, wherein the plate shape metal member has in a region connected to the solder layer a bent portion projecting toward the solder layer.

3. The electronic component according to claim 1, wherein the resin frame has a hollow portion housing the semiconductor substrate therein, and the plate shape metal member is electrically connected to the semiconductor substrate in the hollow portion.

4. The electronic component according to claim 1, wherein the plate shape metal member is embedded and fixed in the resin frame at one end side, and is opened or embedded to be fixed in the resin frame at the other end side.

5. The electronic component according to claim 1, wherein the plate shape metal member comprises a copper alloy or a stainless steel having a Vickers hardness of 50 Hv or more to 300 Hv or less.

6. The electronic component according to claim 3, wherein the resin frame has a projecting portion extending to the hollow portion, the projecting portion having a contact portion positioning the semiconductor substrate in contact with the at least one portion of the semiconductor substrate.

7. A method for manufacturing an electronic component, comprising:
   an insert molding step of forming a resin frame so as to embed at least one end of a plate shape metal member therein, by injecting a resin in a mold with positioning the plate shape metal member in the mold;
   a semiconductor substrate preparation step of providing a semiconductor substrate having an electrical connection region portion formed with a conductive material and a solder layer on the surface in this order;
   a semiconductor substrate placing step of allowing the semiconductor substrate to be placed on the plate shape metal member by the self weight, thereby the solder layer and a portion of the plate shape metal member becoming to be in contact, having a downward facing surface having the solder layer of the semiconductor substrate; and
   a reflow soldering step of dissolving the solder layer by applying heat to the solder layer, and electrically connecting the semiconductor substrate and the plate shape metal member.

* * * * *